United States Patent [19]
Kita

[11] Patent Number: 6,163,759
[45] Date of Patent: Dec. 19, 2000

[54] METHOD FOR CALIBRATING VARIABLE DELAY CIRCUIT AND A VARIABLE DELAY CIRCUIT USING THE SAME

[75] Inventor: Kazumi Kita, Tokyo, Japan

[73] Assignee: Advantest Corporation, Tokyo, Japan

[21] Appl. No.: 09/193,523

[22] Filed: Nov. 17, 1998

[30] Foreign Application Priority Data

Nov. 21, 1997 [JP] Japan ..................... 9-321732

[51] Int. Cl.$^7$ ............................................. G01D 18/00
[52] U.S. Cl. ........................ 702/85; 702/176; 324/130; 714/724; 73/5
[58] Field of Search ................. 327/261, 141; 73/1.01, 5, 6, 1, 35; 368/114; 322/18; D10/40; 324/130; 714/724; 702/85, 176, 1, 108, 127

[56] References Cited

U.S. PATENT DOCUMENTS

| | | | |
|---|---|---|---|
| 4,263,803 | 4/1981 | Burkhardt | 73/1 |
| 5,457,719 | 10/1995 | Guo et al. | 375/373 |
| 5,811,655 | 9/1998 | Hashimoto et al. | 73/1.42 |

*Primary Examiner*—Marc S. Hoff
*Assistant Examiner*—Edward Raymond
*Attorney, Agent, or Firm*—Gallagher & Lathrop; David N. Lathrop

[57] ABSTRACT

In a variable delay circuit calibrating method in which the state of connection of M delay stages connected in cascade through multiplexers and weighted differently is controlled by a control signal value to generate a calibrated amount of delay corresponding to a nominal amount of delay $D_s$ which varies in a predetermined minimum nominal delay step $d_s$, the method comprises the steps of: dividing an amount of delay $D_i$ measured for each given control signal value $CC_i$ by the minimum nominal delay step $d_s$ of a variable delay circuit; calculating first and second errors, $R_k = D_i - d_s k$ and $R_{k+1} = d_s - R_k$, between the value k of an integral part of the resulting quotient and two adjoining nominal amounts of delay $D_{sk}$ and $D_{sk+1}$; making a check to determine if the first error $R_k$ is smaller than an error held in a k-th row of a calibration table in correspondence with a nominal set signal value CS=k; if so, writing the first error $R_k$ and the corresponding control signal value $CC_i$ over the existing values in the column of the k-th row of the calibration table; making a check to determine if the second error $R_{k+1}$ is smaller than an error held in a (k+1)-th row of the calibration table in correspondence with a nominal setting signal value CS=k+1; and, if so, writing the second error $R_{k+1}$ and the corresponding control signal value $CC_i$ over the existing values in the column of the (k+1)-th row of the calibration table. By repeatedly executing these steps for i=0 to i=$2^M$−1, control signal values, which minimize errors between delay times of the variable delay circuit and the nominal amounts of delay, are generated in O-th to K-th rows of the calibration table in correspondence with the respective nominal setting signal values CS.

8 Claims, 8 Drawing Sheets

FIG. 4A

| $CC_i$ | $D_i$ |
|---|---|
| 0 | 0 |
| 1 | 3.1 |
| 2 | 4.7 |
| 3 | 7.8 |
| 4 | 8.8 |
| 5 | 11.9 |
| 6 | 13.5 |
| 7 | 16.6 |
| 8 | 14.3 |
| 9 | 17.4 |
| 10 | 19.0 |
| 11 | 22.1 |
| 12 | 23.1 |
| 13 | 26.2 |
| 14 | 27.8 |
| 15 | 30.9 |
| 16 | 33.1 |
| 17 | 36.2 |
| 18 | 37.8 |
| 19 | 40.9 |
| 20 | 41.9 |
| 21 | 45.0 |
| 22 | 46.6 |
| 23 | 49.7 |
| 24 | 47.4 |
| 25 | 50.5 |
| 26 | 52.1 |
| ⋮ | |
| $2^M-1$ | |

FIG. 4B

| $CC_i$ | $D_i$ |
|---|---|
| 0 | 0 |
| 1 | 3.1 |
| 2 | 4.7 |
| 3 | 7.8 |
| 4 | 8.8 |
| 5 | 11.9 |
| 6 | 13.5 |
| 8 | 14.3 |
| 7 | 16.6 |
| 9 | 17.4 |
| 10 | 19.0 |
| 11 | 22.1 |
| 12 | 23.1 |
| 13 | 26.2 |
| 14 | 27.8 |
| 15 | 30.9 |
| 16 | 33.1 |
| 17 | 36.2 |
| 18 | 37.8 |
| 19 | 40.9 |
| 20 | 41.9 |
| 21 | 45.0 |
| 22 | 46.6 |
| 24 | 47.4 |
| 23 | 49.7 |
| 25 | 50.5 |
| 26 | 52.1 |
| ⋮ | |
| $2^M-1$ | |

FIG. 4C

| CS | $CC_i$ |
|---|---|
| 0 | 0 |
| 1 | 4 |
| 2 | 10 |
| 3 | 15 |
| 4 | 19 |
| 5 | 24 |
| ⋮ | ⋮ |
| K | |

FIG. 7

CALIBRATION TABLE

| CS | ERROR R(psec) | CONT SIG CC |
|---|---|---|
| 0 | | |
| 1 | | |
| 2 | | |
| 3 | | |
| ⋮ | | |
| K | | |

FIG. 9

CALIBRATION TABLE

| CS | ERROR R(psec) | CONT SIG CC |
|---|---|---|
| 0 | 0 | 0 |
| 1 | 1.2 | 4 |
| 2 | 1.0 | 10 |
| 3 | 0.9 | 15 |
| 4 | 0.9 | 19 |
| 5 | 0.3 | 24 |
| ⋮ | ⋮ | ⋮ |
| K | | |

FIG. 8

| CONT | MEAS DELAY | QUO-TIENT | ERROR | ERROR | UPDATE FOR k | | UPDATE FOR k+1 | |
|---|---|---|---|---|---|---|---|---|
| $CC_i$ | $D_i$ | k (CS) | $R_k'$ | $R_{k+1}'$ | $R_k$ | $CC_i$ | $R_{k+1}$ | $CC_i$ |
| 0 | 0 | 0 | 0.0 | 0.0 | 0.0 | 0 | 10.0 | 0 |
| 1 | 3.1 | 0 | 3.1 | 6.9 | 0.0 | 0 | 6.9 | 1 |
| 2 | 4.7 | 0 | 4.7 | 5.3 | 0.0 | 0 | 5.3 | 2 |
| 3 | 7.8 | 0 | 7.8 | 2.2 | 0.0 | 0 | 2.2 | 3 |
| 4 | 8.8 | 0 | 8.8 | 1.2 | 0.0 | 0 | 1.2 | 4 |
| 5 | 11.9 | 1 | 1.9 | 8.1 | 1.2 | 4 | 8.1 | 5 |
| 6 | 13.5 | 1 | 3.5 | 6.5 | 1.2 | 4 | 6.5 | 6 |
| 7 | 16.6 | 1 | 6.6 | 3.4 | 1.2 | 4 | 3.4 | 7 |
| 8 | 14.3 | 1 | 4.3 | 5.7 | 1.2 | 4 | 3.4 | 7 |
| 9 | 17.4 | 1 | 7.4 | 2.6 | 1.2 | 4 | 2.6 | 9 |
| 10 | 19.0 | 1 | 9.0 | 1.0 | 1.2 | 4 | 1.0 | 10 |
| 11 | 22.1 | 2 | 2.1 | 7.9 | 1.0 | 10 | 7.9 | 11 |
| 12 | 23.1 | 2 | 3.1 | 6.9 | 1.0 | 10 | 6.9 | 12 |
| 13 | 26.2 | 2 | 6.2 | 3.8 | 1.0 | 10 | 3.8 | 13 |
| 14 | 27.8 | 2 | 7.8 | 2.2 | 1.0 | 10 | 2.2 | 14 |
| 15 | 30.9 | 3 | 0.9 | 9.1 | 0.9 | 15 | 9.1 | 15 |
| 16 | 33.1 | 3 | 3.1 | 6.9 | 0.9 | 15 | 6.9 | 16 |
| 17 | 36.2 | 3 | 6.2 | 3.8 | 0.9 | 15 | 3.8 | 17 |
| 18 | 37.8 | 3 | 7.8 | 2.2 | 0.9 | 15 | 2.2 | 18 |
| 19 | 40.9 | 4 | 0.9 | 9.1 | 0.9 | 19 | 9.1 | 19 |
| 20 | 41.9 | 4 | 1.9 | 8.1 | 0.9 | 19 | 8.1 | 20 |
| 21 | 45.0 | 4 | 5.0 | 5.0 | 0.9 | 19 | 5.0 | 21 |
| 22 | 46.6 | 4 | 6.6 | 3.4 | 0.9 | 19 | 3.4 | 22 |
| 23 | 49.7 | 4 | 9.7 | 0.3 | 0.9 | 19 | 0.3 | 23 |
| 24 | 47.4 | 4 | 7.4 | 2.6 | 0.9 | 19 | 0.3 | 24 |
| 25 | 50.5 | 5 | 0.5 | 9.5 | 0.3 | 24 | 9.5 | 25 |
| 26 | 52.1 | 5 | 2.1 | 7.9 | 0.3 | 24 | 7.9 | 26 |
| ⋮ | | | | | | | | |
| $2^M-1$ | | | | | | | | |

METHOD FOR CALIBRATING VARIABLE DELAY CIRCUIT AND A VARIABLE DELAY CIRCUIT USING THE SAME

BACKGROUND OF THE INVENTION

The present invention relates to a variable delay circuit calibrating method applicable to a timing generator which is used, for example, in an IC tester, and a variable delay circuit which performs calibration by the method.

Conventional IC testers are provided with a timing generator, and use a timing signal available therefrom to define, for example, the timing of the rise and fall of a test signal which is applied to an IC under test.

The IC tester changes little by little the tiring of the rise and fall of the test pattern signal for application to the IC under test to conduct various tests thereon such as measurement of the range of timing over which the IC under test operates normally. To perform this, the timing generator is designed to be capable of finely changing the timing generation.

FIG. 1 is a diagrammatic representation of the basic construction of a variable delay circuit. M delay stages $DY_1$ to $DY_M$ are connected in cascade through M−1 multiplexers $MUX_1$ to $MUX_{M-1}$, respectively, and the output of the last delay stage $DY_M$ is connected via a multiplexer $MUX_M$ to an output terminal OUT. The amounts of delay of the delay stages $DY_1$ to $DY_M$ are weighted differently. In this prior art example, an m-th delay stage $DY_m$ is weighted by a series connection of $2^m$ delay elements DE having about the same amount of delay d. Each delay element DE is formed, for example, by an AND gate, and has an amount of delay of 1 to 2 psec. The delay stages $DY_1$ to $DY_M$ have their inputs and outputs connected to input terminals A and B of the multiplexers $MUX_1$ to $MUX_M$ respectively corresponding thereto. The multiplexers $MUX_1$ to $MUX_M$ select and output either one of signals fed to their input terminals A and B in response to control signals $c_1$ to $c_M$ applied to their control terminals S. Let it be assumed that each multiplexer selects the input terminal A or output terminal B, depending on whether the control signal c fed to the control terminal S is high- or low-level. Accordingly, when signals to control input terminals T1 to TM are all low-level, the multiplexers $MUX_1$ to $MUX_M$ all switch to the input terminals B, with the result that the delay time between input and output terminals IN and OUT is minimized. This minimum delay time will hereinafter be referred to as an offset delay time.

If all the delay elements ideally have the same amount of delay d, it is possible with the variable delay circuit of FIG. 1 that the entire amount of delay from the input to output terminals IN and OUT is set at $2^M$ values which differ by steps of d. In such an instance, the range over which amounts of delay can be set is 0 to $d(2^M-1)$. Then, letting the delay resolution (the minimum delay unit) necessary for setting of timing in the timing generator of the IC tester be represented by $d_s=d$ and the maximum amount of delay by $d_s(2^M-1)$ as depicted in FIG. 2-Row A, desired amounts of delay can be set over the required range in the minimum delay unit which is required by the FIG. 1 construction. The graduations in ds units depicted in FIG. 2-Row A will hereinafter be referred to as nominal delay graduations and their values $D_{s1}$, $D_{s2}$, $D_{s3}$, . . . as nominal delay values.

In practice, however, the amounts of delay d of the delay elements DE vary, and delays by other connection lines than the delay elements are also added. Then, assume that an N-bit delay setting signal CS is used to set nominal amounts of delay. In this instance, as depicted in FIG. 2-Row B, the amount of delay d of each delay element DE is chosen to be sufficiently smaller (for example, less than ½) than the nominal delay resolution $d_s$ required for the variable delay circuit, and the value M is determined so that substantially the maximum amount of delay $d(2^M-1)$ becomes larger than the required maximum amount of delay $d_s(2^N-1)$. Then the amounts of delay are measured for all of $2^M-1$ set values of an M-bit control signal CC. And the N-bit delay setting signal values CS are predetermined which provide amounts of delay that minimize errors which deviate from the nominal delay values $D_{s1}$, $D_{s2}$, . . . of the nominal graduations depicted in FIG. 2-Row A.

Since the amounts of delay of the delay elements DE are subject to variation as referred to above, it is necessary to determine the control signal values CC which minimize errors of actual delay times with respect to nominal delay set values 0 psec, 10 psec, 20 psec, 30 psec, . . . . When the delay stages $DY_1$, $DY_2$, $DY_3$, . . . are formed by semiconductor elements, their delay times vary with a temperature change as well.

In view of the above, the conventional IC tester suspends the test at fixed time intervals after its startup, then measures delay times by all combinations of the delay stages $DY_1$ to $DY_M$, then based on the measured delay times, selects the optimum combination of delay stages (that is, the control signal values CC) which minimize errors with respect to the set nominal amounts of delay, and performs such a calibration as to make the actual delay times bear as linear a relationship as possible to the nominal amounts of delay.

FIG. 3 shows an example of a conventional variable delay circuit which performs such operations. Reference numeral 11 denotes a converter connected to the control input terminals $T_1$ to $T_M$. The nominal delay setting signal CS is converted by the converter 11 to the control signal value CC for selecting an error-minimizing combination of delay stages obtained by measurement. The converted control signal value CC is used to control the multiplexers $MUX_1$ to $MUX_M$.

In FIG. 4A there is depicted an example of the results of measurement of the delay times corresponding to the respective values of the control signal CC. Let it be assumed here that the required nominal minimum delay step (resolution) $d_s$ is 10 psec and that the delay time up to 1 nsec can be set in steps of 10 psec nominally. In the measurements the amount of delay of each delay element DE was about 2 psec, and the delay times were measured by controlling the multiplexers $MUX_1$ to $MUX_M$ with the control signal value $CC=(c_1, c_2, c_3, \ldots, c_{10})$ of M=10 bits while changing the control signal value CC from 0 to $2^{10}-1$. It must be noted here that the delay times are reverse in length between columns 7 and 8 of the control signal value CC and between 23 and 24. Conventionally, the measured values of the delay times, when obtained, are immediately sorted (rearranged) in an ascending order as depicted in FIG. 4B. The values of the control signal CC, which provided respective delay times, are also sorted corresponding thereto.

From such rearranged delay times are selected a sequence of delay times arranged nearly at required intervals of, for example, $d_s=10$ psec, and the values of the control signal CC accompanying the selected delay times are sequentially arranged in a one-to-one correspondence with the nominal delay setting values CS in a calibration table (FIG. 4C). The CS–CC calibration table is stored in the converter 11. That is, when supplied with the nominal delay setting signal CS, the converter 11 converts its value to the control signal CC, which is used to control the multiplexers $MUX_1$ to $MUX_M$ to provide a delay time closest to the ideal value at that point in time.

As described above, the prior art employs the method of obtaining the control signal value CC by measuring the delay times of the delay stages $DY_1$ to $DY_M$, rearranging the measured delay times through sorting, and selecting from the rearranged delay times a sequence of delay times which switch at predetermined intervals. Hence, the conventional method is time-consuming.

That is, since the actual IC tester is provided with a large umber (1500 to 2000) of such variable delay circuits 100 as depicted in FIG. 3, much time is needed to calibrate the delay time of each variable delay circuit. Additionally, the prior art adopts the method of obtaining the control signal value CC while storing the arrangement of the measured delay times, the arrangement of the sorted delay times and the arrangement of the delay times selected from the sorted delay times; hence, simultaneous calibration of delay times of, for example, about 100 variable delay circuits inevitably occupies an enormously wide storage area of a memory.

SUMMARY OF THE INVENTION

It is therefore an object of the present invention to provide a calibration method which speeds up the calibration of the delay time of a variable delay circuit and dispenses with the need for occupying a wide storage area, and a variable delay circuit which performs calibration by the method.

According to the present invention, there is provided a variable delay circuit calibrating method in which the state of connection of M delay stages connected in cascade through multiplexers and weighted differently is controlled by a control signal value to generate a calibrated amount of delay corresponding to a nominal amount of delay $D_s$ which varies in a predetermined minimum nominal delay step $d_s$, and which comprises the steps of: dividing an amount of delay $D_i$ measured for each given control signal value $CC_i$ by the minimum nominal delay step $d_s$ of a variable delay circuit; calculating first and second errors, $R_k = D_i - d_s k$ and $R_{k+1} = d_s - R_k$, between the value k of an integral part of the resulting quotient and two adjoining nominal amounts of delay $D_{sk}$ and $D_{sk+1}$; making a check to determine if the first error $R_k$ is smaller than an error held in a k-th row of a calibration table in correspondence with a nominal set signal value CS=k; if so, writing the first error $R_k$ and the corresponding control signal value $CC_i$ over the existing values in the column of the k-th row of the calibration table; making a check to determine if the second error $R_{k+1}$ is smaller than an error held in a (k+1)-th row of the calibration table in correspondence with a nominal setting signal value CS=k+1; and, if so, writing the second error $R_{k+1}$ and the corresponding control signal value $CC_i$ over the existing values in the column of the (k+1)-th row of the calibration table. By repeatedly executing these steps for i=0 to i=$2^M-1$, control signal values, which minimize errors between delay times of the variable delay circuit and the nominal amounts of delay, are generated in O-th to K-th rows of the calibration table in correspondence with the respective nominal setting signal values CS As described above, according to the present invention, upon each measurement of the delay time of the variable delay circuit which is set by each control signal, the calibration is updated with the control signal value which reduces the error. Hence, the calibrating method dispenses with the need for sorting and permits reduction of the time for updating the delay times. Moreover, since the calibration table is directly updated, the data storage area needs only to store the error values and the control signal values. Besides, since the number of addresses used is equal to the number K of the nominal setting signals $CS_i$ which provide the nominal amounts of delay, the storage area needed is smaller than in the past.

BRIEF DESCRIPTION OF THE DRAWINGS

FIGS. 4A–4C show tables for explaining an example of processing by the conventional calibration method;

FIG. 7 is a diagram showing a calibration table which is generated by the present invention;

FIG. 8 is a table for explaining an example of processing by the calibration method depicted in FIG. 5;

FIG. 9 is a diagram depicting an example of a calibration table generated by the processing of FIG. 8.

DETAILED DESCRIPTION OF THE PREFERRED EMBODIMENT

Figure 1:
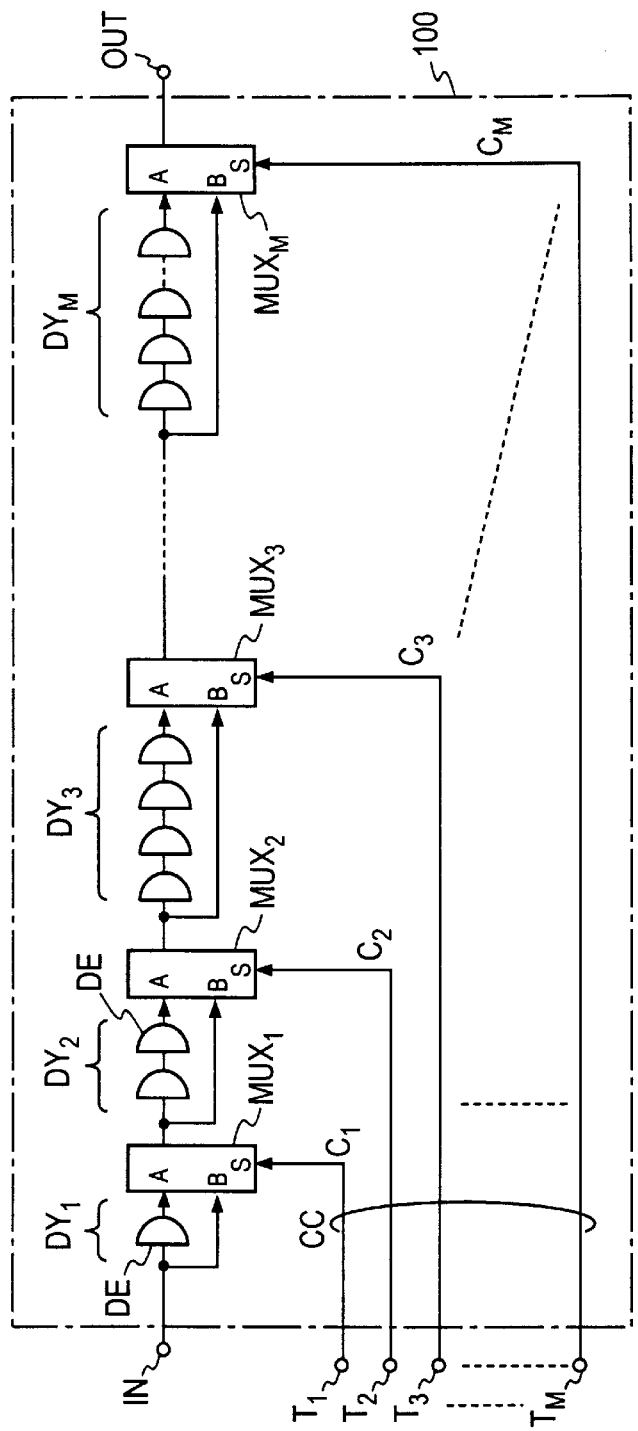
FIG. 1 is a block diagram depicting a conventional variable delay circuit.
Figure 2:
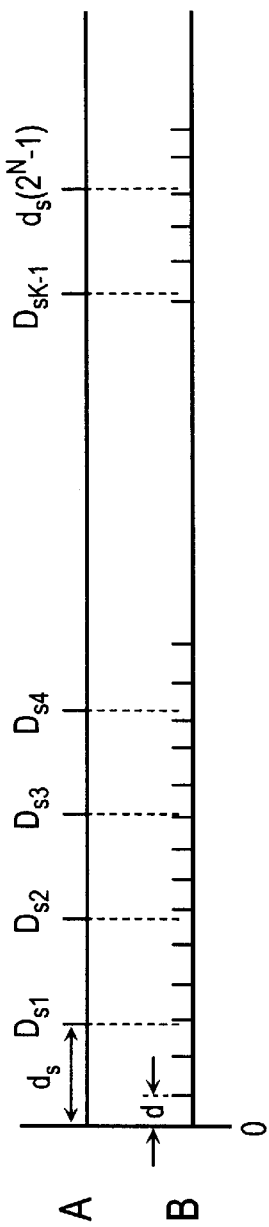
FIG. 2 is a diagram for explaining a conventional method for calibrating a variable delay circuit.
Figure 3:
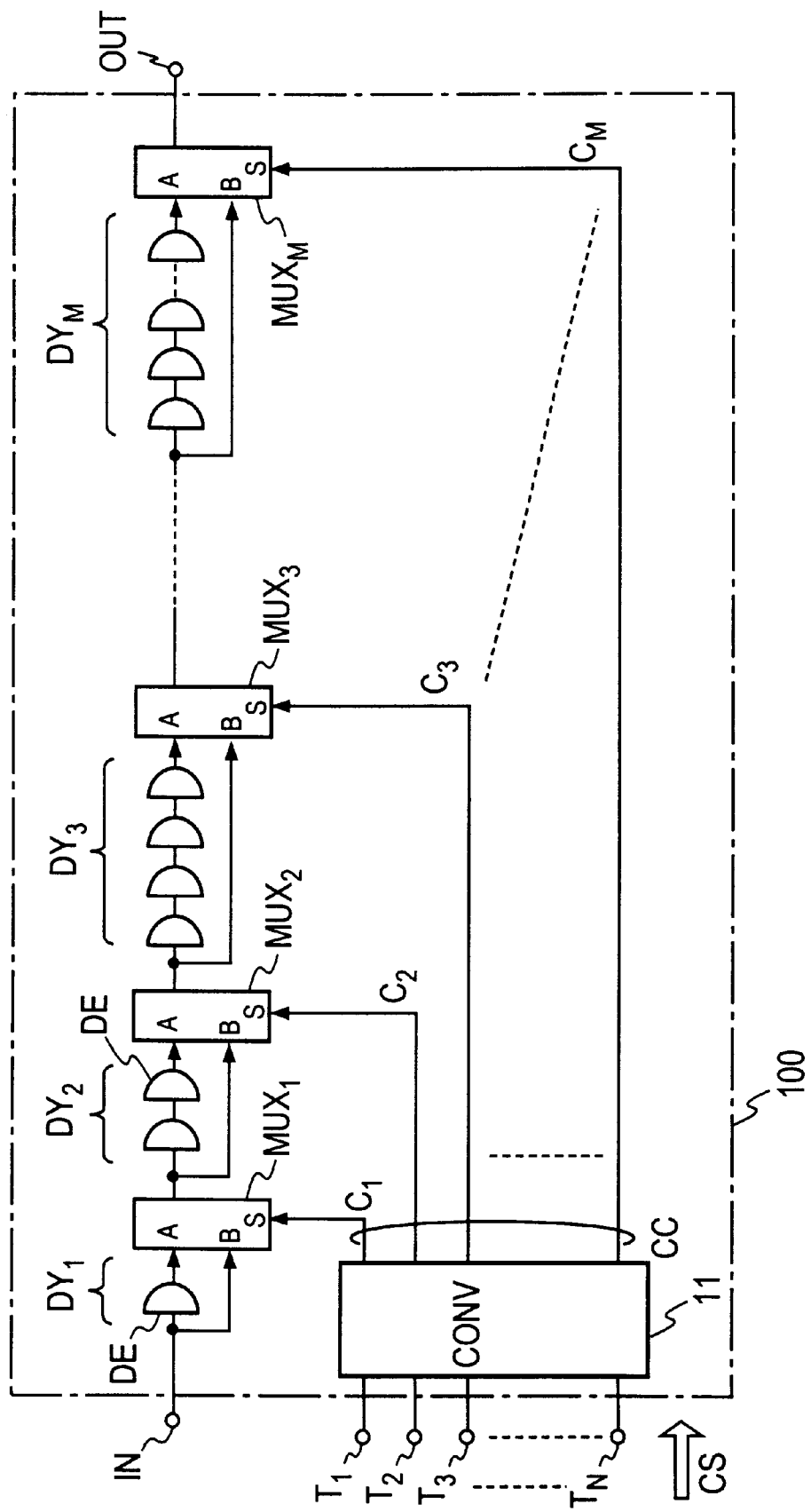
FIG. 3 is a block diagram for explaining an example of a conventional variable delay circuit provided with a converter having a calibration table.
Figure 5:
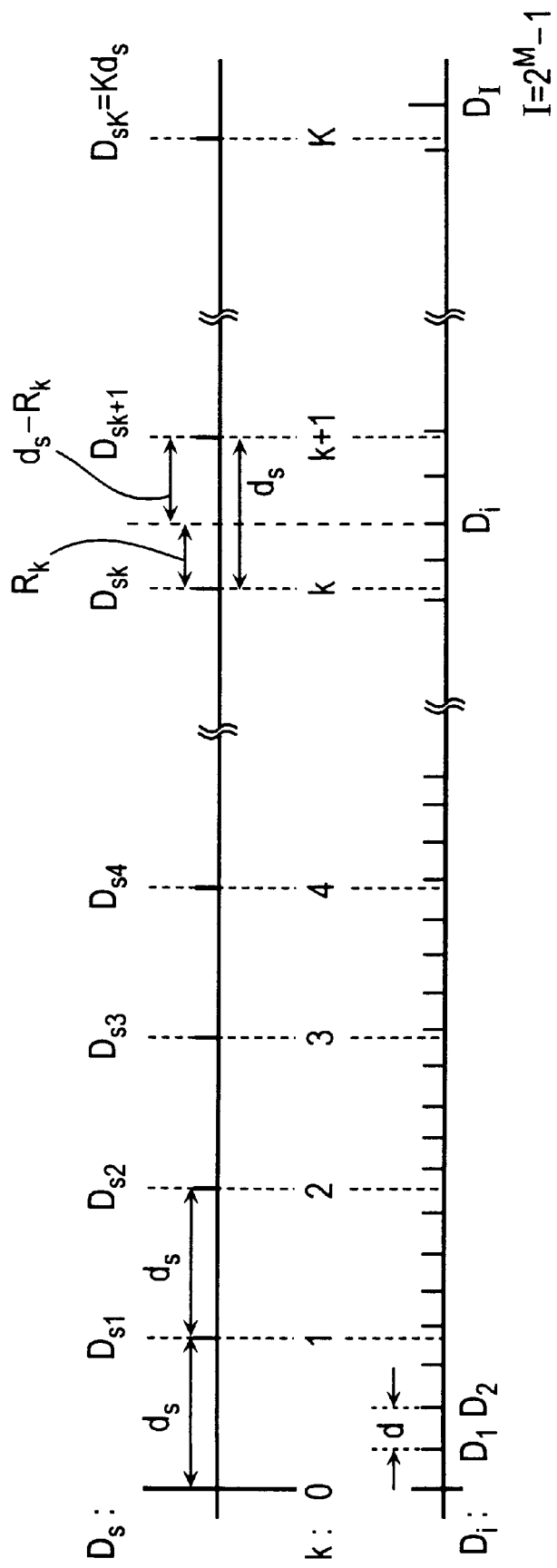
FIG. 5 is a diagram for explaining delay errors for use in the present invention.

A description will be given first, with reference to FIG. 5, of errors $R_k$ and $R_{k+1}$ of measured delay time $D_i$ with respect to two adjacent nominal delay values $D_{sk}$ and $D_{sk+1}$, which are used in the principle of the calibration method according to the present invention. As depicted in FIG. 5, row A, the delay time $D_i$ for each minimum variable delay step d sufficiently smaller than the nominal delay step $d_s$ (a fixed value) as shown in FIG. 5. row B, which is set by the M-bit control signal CC, is measured with respect to the nominal delay values $D_{s1}, D_{s2}, D_{s3}, \ldots$ for each nominal delay step $d_s$. The errors $R_k$ and $R_{k+1}$ of the delay time $D_i$ with respect to the two adjacent nominal delay values $D_{sk}$ and $D_{sk+1}$ (where $Dsk \leq D_i \leq D_{sk+1}$) before and after the delay time $D_i$ are calculated as follows:

$$k = \text{int}[D_i/d_s] \tag{1}$$

where int[a/b] means the value of the integral part of a/b.

$$\text{Error for } D_{sk}: R_k' = D_i - d_{sk} \tag{2}$$

$$\text{Error for } D_{sk+1}: R_{k+1}' = D_{sk+1} - D_i = d_s - R_k' \tag{3}$$

Incidentally, the value of the delay time of the variable delay circuit 100, which is set by the control signal, increases substantially in the order of control signal values $CC_i$: i=0, 1, 2, ..., $2^M-1$. However, since the actual delay time $D_i$ is set by combining the delay stages $DY_1, DY_2, \ldots, DY_M$ which have varying delay times deviating from ideal values, the increasing order of the value i does not necessarily match the order of the delay time $D_i$ over the entire region of the control signal $CC_i$, that is, from i=0 to ($2^M 1$).

The error $R_k'$ is also the remainder resulting from division of $D_i$ by $d_s$. The values k (=0, 1, 2, ..., K) correspond to the numbers of the nominal delay values $D_{s0}, D_{s1}, D_{s2}, \ldots, D_{sk}$. Letting the minimum variable delay step of the variable delay circuit, which can be set by the M-bit control signal $CC_i$, be represented by d, $kd_s < (2^M-1)d$.

Figure 6:
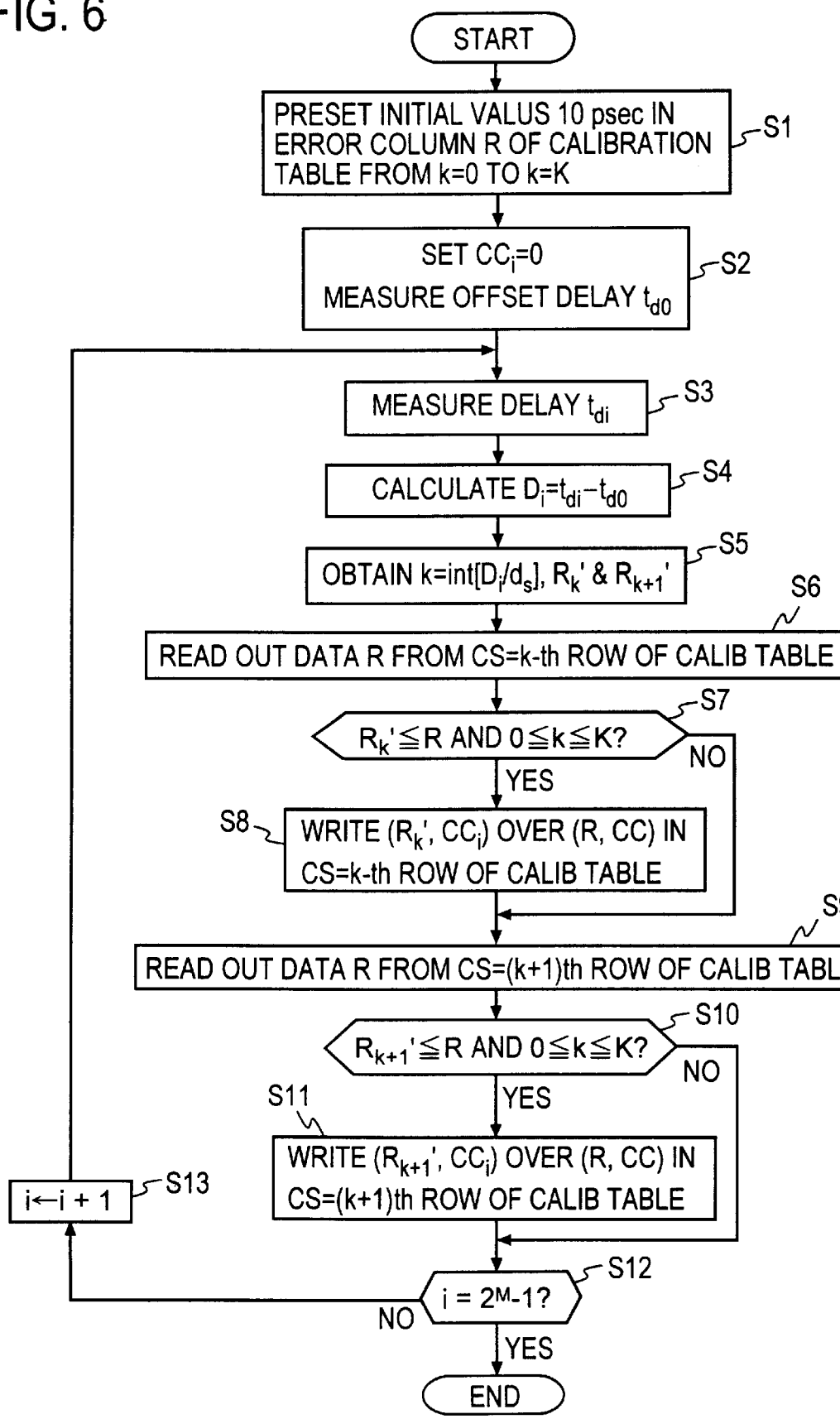
FIG. 6 is a flowchart for explaining the procedure of calibration of a variable delay circuit according to the present invention.

FIG. 6 is a flowchart showing the procedure of the delay calibration method according to the present invention which is applied to the variable delay circuit described later on with reference to FIG. 10. In the present invention, a calibration table is prepared into which the errors $R_k$ between nominal delay values $D_k = kd_s$ and the measured delay values $D_i$ and the control signals $CC_i = (C_1, c_2, \ldots, C_M)$, which are set in the delay stages $DY_1$ to $DY_M$ and provide the measured delay values $D_i$, are written in correspondence with the nominal setting signal values CS=0 to K of the K+1 nominal delay values $0, d_s, 2d_s, 3d_s, \ldots Kd_s$. That is, the area for the calibration table for storing the errors $R_k$ and the setting control signal values $CC_i$ in correspondence with CS=k=0, 1, 2, ..., K is set in a memory (12B in FIG. 10) of the device. Further, in this embodiment, the delay time between the input and output terminals IN and OUT of the variable delay circuit 100 of FIG. 10 measured with the control signal value $CC_i$ set therein is represented by $t_{di}$, and a delay value $D_i = t_{di} - t_{d0}$ is calibrated which is obtained by removing the offset delay time $t_{d0}$ (a measured delay time when the control signal $CC_0 = 0$ is set) from the measured delay time $t_{di}$.

Step S1: In the column of the error R of the calibration table, prestore arbitrary initial values $R_s$ greater than $d_s$ in correspondence with all values of k.

Step S2: Set M-bit control signal $CC_0 = 0 (= 0, 0, 0, \ldots, 0)$ when setting i=0 in the multiplexers $MUX_1$ to $MUX_M$, and measure the delay time at that point in time as an offset delay $t_{d0}$.

Step S3: Set the control signal value $CC_i$ and measure the delay time $t_{di}$.

Step S4: Calculate the measured delay time $D_i = t_{di} - t_{d0}$.

Step S5: Divide the measured delay value $D_i$ by the nominal delay resolution (the minimum variable delay step) $d_s$ to obtain the quotient $k = \text{int}(D_i/d_s)$ and the remainder $R_k' = D_i - kd_s$. As depicted in FIG. 5, the remainder $R_k'$ is an error of the measured value $D_i$ with respect to a CS=k-th nominal delay value $D_{sk} = kd_s$. Further, calculate an error $R_{k+1}' = d_s - R_k'$ of the measured value $D_i$ with respect to the CS=(k+1)-th nominal delay value $D_{sk+1} = (k+1)d_s$.

Step S6: Read out the error R from the CS=k-th row in the calibration table.

Step S7: Make a check to determine if $R_k' \leq R$ and if $0 \leq k \leq K$. If the determination result is YES, go to step S8. Otherwise, go to step S9.

Step S8: If the determination result is YES, write the error Rk' as a new error $R_k$ over the existing value in the error column of the CS=k-th row in the calibration table, and write the control signal value $CC_i$ over the existing value in the control signal value column.

Step S9: Read out the error R from the (k+1)-th row of the calibration table.

Step S10: Make a check to determine if $R_{k+1}' \leq R$ and if $0 \leq k+1 \leq K$. If the determination result is YES, go to step S11. Otherwise, go to step S12.

Step S11: If the determination result is YES, write the error $R_{k+1}'$ as a new error R over the existing value in the error column of the (k+1)-th row in the calibration table, and write the control signal value $CC_i$ over the existing value in the control signal value column.

Step S12: Make a check to determine if $CC_i = i$ has reached $2^M - 1$. If so, end the calibration process. Otherwise, go to step S13.

Step S13: Increment i by one step and return to step S3.

By the above calibration process, calibration is performed to minimize errors based on the results of measurement of the delay times corresponding to all M-bit control signal values $CC_i = (c_1, c_2, \ldots c_M)$ (i=0, 1, 2, ..., I, where $I = 2^M - 1$). As the result of this, there are obtained in the calibration table of FIG. 7 control signal values Cci which minimize errors with respect to nominal delay values $D_s k$ for each nominal delay resolution $d_s$ over the range of from 0 to $d_s k$. Usually, the amount of delay d of the delay element DE is chosen to be less than one-half of the nominal delay resolution $d_s$, and the total number $2_M - 1$ of the control signal values which are set in the delay stages $DY_1$ to $DY_M$ is very large as compared with the number of steps K by the delay resolution $d_s$ which covers the maximum range of delay of the variable delay circuit shown in the calibration table of FIG. 7. Hence, the conventional calibration method requires a large-size table for storing measured values of delay times for the setting of $2^M - 1$ control signal values, whereas the calibration table needed in the present invention is very small. In addition, the present invention does not involves sorting of the measured delay times nor does it require their sampling with the nominal delay resolution $d_s$.

FIG. 8 is a table showing an example of processing which is performed following the procedure depicted in FIG. 6. Assume that the step of the nominal delay value (delay resolution) $d_s$ for calibration is $d_s = 10$ psec and that the amounts of delay of the delay stages $DY_1$ to $DY_5$ are as follows:

$DY_1$: 3.1 psec $DY_2$: 4.7 psec $DY_3$: 8.8 psec $DY_4$: 14.3 psec $DY_5$: 33.1 psec Further, let it be assumed that the amounts of delay of the delay stages $DY_6$ to $DY_M$ are arbitrary, and that the error $R_k$, which is held as an offset delay d in a (k=0)-th row of the calibration table, is 0.

The measured delay time $D_i$ is divided by 10 psec, and let the integral part of the quotient be represented by k. The errors $R_k'$ and $R_{k+1}$ of the measured delay time $D_i$ with respect to the nominal delay value 10 k (psec) and the nominal delay value 10(k+1) are shown in their columns of the table depicted in FIG. 8. As described previously, according to the method of the present invention, when the error Rk' measured for the control signal value $CC_i$ is smaller than the error $R_k$ held in the k-th row of the calibration table, the error $R_k$ and the control signal value $CC_i$ in the k-th row of the calibration table are updated with the measured error and the corresponding control signal value. When the measured error $R_{k+1}'$ is smaller than the error $R_{k+1}$ held in the (k+1)-th row of the calibration table, the error $R_{k+1}$ and the control signal value $CC_i$ in the (k+1)-th row of the calibration table are updated with the measured error and the corresponding control signal value.

In FIG. 8, since it is assumed that when the control signal value $CC_i$ is 0 to 4, k=0 and that the delay (the offset delay) is 0 when $CC_i = 0$, the error $R_k = 0$ and the control signal value $CC_i$ at this time are held in the (k=0)-th row of the calibration table. By repeating steps S3 to S13 in FIG. 13 for the control signal values $CC_i$ from i=0 to i=4, $R_{k+1} = 1.2$ and $CC_i = 4$ are held in the (K+1=1)-th row of the calibration table. With $CC_i = 5$ (i.e. I=5), k=1, and since the error $R_k' = 1.9$ is larger than $R_{k+1} = 1.2$ when k=0, the data in the (k=1)-th row of the calibration table will be not updated, but since in the (k+1=2)-th row $R_{k+}' = 10$ (initial value), $R_{k+}' = 8.1$ and $CC_i = 5$ are written over the previous data.

In the measurements for $CC_i=5$ to 10, since all the errors $R_k$ are larger than 1.2, the existing data in the (k=1)-th row of the calibration table is not updated. On the other hand, the (k+1=2)-th row is updated in each of measurements for $CC_i=5$ to 7, but when $CC_i=8$, the measured error $R_{k+1}'=5.7$ is larger than the error $R_{k+1}=3.4$ held in the (k+1)-th row, and hence no updating takes place. In the measurements for $CC_i=9$ and 10, the (k+1=2)-th row is updated again. Ultimately, the error $R_{k+1}=1.0$ for $CC_i=10$ and this control signal value $CC_i=10$ are stored in the (k+1=2)-th row of the calibration table. For $CC_i=11$ to 14, k=2, and since errors $R_k'$ are all larger than the data $R_{k+1}=1.0$ already stored in the second row when k=1, the data ($R_{k+1}=1.0$, $CC_i=10$) in the (k=2)-th row is held therein, but data in the (k+1=3)-th row is updated. For $CC_i=15$, k=3. Since the error $R_k'=0.9$ at this time is smaller than the error $R_{k+1}'=2.2$ for k=2 held in the (k=3)-th row, data in the (k=3)-th row of the calibration table is updated with the data ($R_k=0.9$, $CC_i=15$). Thereafter, the data in the (k=3)-th row is held until $CC_i=18$, but the data ($R_{k+1}$, $CC_i$) in the (k+1=4)-th row is updated for each measurement.

By the processing of FIG. 8, the calibration table depicted in FIG. 9 is obtained. The table of FIG. 8 is intended merely for explaining the process of preparing the calibration table of FIG. 6; no memory area is needed corresponding to such a table. The memory area required is one that corresponds to the calibration table of FIG. 6. The feature of the present invention is to automatically obtain the calibration table of FIG. 9 by repeatedly executing the determination by comparison and updating described above with reference to FIGS. 5 and 8.

Figure 10:
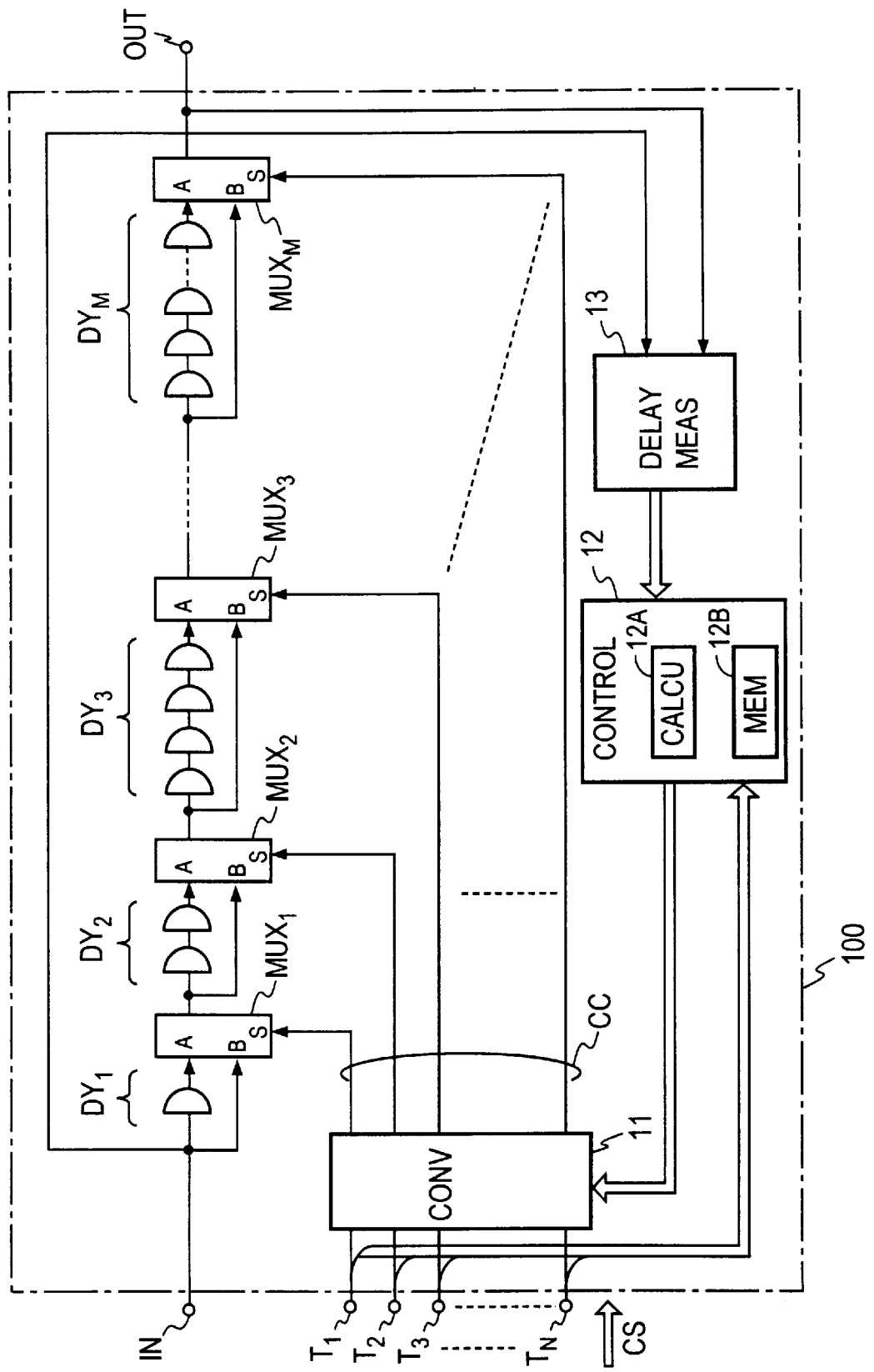
FIG. 10 is a block diagram illustrating an embodiment of a variable delay circuit provided with a controller for executing the calibration by the calibration method according to the present invention.

In FIG. 10 there is illustrated an embodiment of the variable delay circuit 100 which uses the above-described calibration method. A delay time measurement part 13 measures the time difference between the input signal fed to an input terminal IN and the signal provided to the output terminal OUT of the variable delay circuit 100, thereby measuring its delay time. The measured result is input into a controller 12. The controller 12 is formed, for example, by a microcomputer, and has a calculating part 12A and a memory 12B. In the memory 12B there is defined the area for building the aforementioned calibration table. In the memory 12B there is also stored a program for executing the calibration method described previously with respect to FIG. 6. The calculating part 12A follows the program to perform calibration of the measured delay time $D_i$ provided from the delay time measuring part 13. That is, the calculating part 12A divides the delay time $D_i$ by the minimum resolution ds of the preset variable delay circuit 100, and calculates the integral value k and the error values $R_k$ and $R_{k+1}$. These calculated values and the control signal values $Cs_i$ are written in the calibration table of FIG. 7 in the memory 12B. After completion of the calibration table, the control signal value CC which minimizes the error with respect to the input signal value $CS_i$ (i.e. the value k) is read out of the calibration table and written in the converter 11.

In the case of setting desired timing of an IC test pattern by the variable delay circuit 100 of FIG. 10, when the control signals $CS_i$ for specifying the desired timing are applied to the terminals T1 to TN, the converter 11 reads out the corresponding control signals CC and applies them to the multiplexers $MUX_1$ to $MUX_M$. By this, it is possible to set desired amounts of delay with high accuracy.

EFFECTS OF THE INVENTION

As described above, according to the present invention, simultaneously with measuring the delay time of the variable delay circuit, the integral value k obtained by dividing the measured time $D_i$ by the nominal delay step $d_s$ and the errors $R_k'$ and $R_{k+1}'$ with respect to two adjoining nominal delays $d_s k$ and $d_s(k+1)$ are calculated. If the measured error $R_k'$ is smaller than the error $R_k$ held in the k-th row of the calibration table, data ($R_k'$, $CC_i$) is written as new data ($R_k$, $CC_i$) over the previous data in the k-th row. If the measured error $R_{k+1}'$ is smaller than the error $R_{k+1}$ held in the (k+1)-th row of the calibration table, data ($R_{k+1}'$, $CC_i$) is written as new data ($R_{k+1}$, $CC_i$) over the previous data in the (k+1)-th row. With this processing, the required delay time calibration is already complete when the measurement of the delay time for every control signal value $CC_i$ and the update of the calibration table are completed. Accordingly, unlike the prior art, the measured delay times of the variable delay circuit in all switched conditions need not be rearranged in ascending order; therefore, the calibration can be done in a short time even if the number of variable delay circuits used is large.

In order that the error Rk and the control signal Cci may be stored in the memory 12B of the controller 12 in correspondence with k as depicted in FIG. 9, addresses of the same number as that K of the nominal delay minimum steps ds need only to be provided which correspond to k=0 to $k_i=K$. For example, in the case of changing the delay time by the variable delay time from 0 to 1 nsec in steps of 10 psec as described previously, K-100. Hence, even if a large number of variable delay circuits are calibrated, the storage area used can be made small as a whole.

In contrast to this invention method, the conventional method requires at least $2^M-1$ addresses because it is necessary to store in a memory the data measured for all values of the M-bit control signal. For example, in the case of a control signal of M=10 bit, the required number of addresses is around 1000.

It will be apparent that many modifications and variations may be effected without departing from the scope of the novel concepts of the present invention.

What is claimed is:

1. A method for calibrating, for a nominal amount of delay $D_{sk}=d_s k$, k=0, 1, 2, ..., K, for each nominal minimum delay step $d_s$, a variable delay circuit in which the state of a cascade connection of M differently weighted delay stages is selectively controlled by a desired one of control signal values $CC_i$ from O to K to thereby set a desired amount of delay of said variable delay circuit, said M and K being integers equal to or greater than 2, said method comprising the steps of:

(a) predefining in a memory an at least K-row calibration table having columns for holding errors and control signal values which provide the errors;

(b) measuring the amount of delay $D_i$ of said variable delay circuit set by said control signal value $CC_i$;

(c) dividing said measured amount of delay $D_i$ by said minimum nominal step $d_s$ and calculating an integral part k of the resulting quotient and first and second errors $R_k=D_i-d_{sk}$ and $R_{k+1}=d_s-R_k$ of said measured amount of delay $D_i$ with respect to two adjoining nominal amounts of delay $D_{sk}$ and $D_{sk+1}$;

(d) making a check to determine if said calculated first error $R_k$ is smaller than an error held in a k-th row of said calibration table, and if so, writing said calculated first error $R_k$ and the corresponding control signal value $CC_i$ over previous data in the column of said k-th row;

(e) making a check to determine if said calculated second error $R_{k+1}$ is smaller than an error held in a (k+1)-th column of said calibration table, and if so, writing said calculated second error $R_{k+1}$ and the corresponding control signal values $CC_i$ over previous data in the column of said (k+1)-th row; and (f) executing said steps (b) to (e) from i=0 to $i=2^M-1$, thereby obtaining, in O-th to K-th rows of said calibration table, control signal values which minimize error with respect to said nominal amount of delay.

2. The method of claim 1, wherein said step (s) includes a step of prewriting a fixed value greater than said nominal delay step $d_s$, as an initial value in the column of error of said calibration table.

3. The method of claim 1 or 2, wherein, if the delay time $t_{d0}$ between the input and output of said variable delay circuit, when supplied with a control signal $CC_0$ for bypassing all of said delay stages, is taken as an offset delay, said step (b) includes a step of measuring the delay time $t_{d1}$ between the input and output of said variable delay circuit for each of said control signal values $CC_i$ and obtaining said amount of delay $D_i$ as given by the following equation:

$$D_i = t_{d1} - t_{d0}.$$

4. The method of claim 1 or 2, wherein an m-th (m=1, 2, ..., M) one of said delay stages is weighted about $2^{m-1}$.

5. A variable delay circuit which generates a delay calibrated by a control signal value in correspondence with a nominal amount of delay $D_{sk}$ for each nominal minimum delay step $d_s$, said variable delay circuit comprising:

M delay stages of differently weighted amounts of delay;

M multiplexers connected to the outputs of said M delay stages, respectively, for selectively outputting inputs to and outputs from said delay stages, said M delay stages and said M multiplexers being connected in cascade;

control signal converting means responsive to a control signal fed thereto, for generating desired control signal values from O to K and applying them to said multiplexers to set in said M delay stages desired amounts of delay corresponding to nominal amounts of delay $D_{sk} = d_s k$ (k=0, 1, 2, ..., K) for each nominal minimum delay step, said M and K being integers equal to or greater than 2;

delay time measuring means for measuring the delay time between the input and output of said variable delay circuit upon each change of said control signal values from O to K;

a memory having defined therein an at least K-row calibration table with columns for prestoring an error and a control signal value which provides said error; and calculating means for: dividing an amount of delay $D_i$ measured for each given control signal value $CC_i$ by the minimum nominal delay step $d_s$ of a variable delay circuit; calculating first and second errors, $R_k = D_i - d_s k$ and $R_{k+1} = d_s - R_k$, between the value k of an integral part of the resulting quotient and two adjoining nominal amounts of delay $D_{sk}$ and $D_{sk+1}$; making a check to determine if the first error $R_k$ is smaller than an error held in a k-th row of a calibration table in correspondence with a nominal set signal value CS=k; if so, writing the first error $R_k$ and the corresponding control signal value $CC_i$ over the existing values in the column of the k-th row of the calibration table; making a check to determine if the second error $R_{k+1}$ is smaller than an error held in a (k+1)-th row of the calibration table in correspondence with a nominal setting signal value CS=k+1; if so, writing the second error $R_{k+1}$ and the corresponding control signal value $CC_i$ over the existing values in the column of the (k+1)-th row of the calibration table; and repeatedly executing these operations for i=0 to $i=2^M-1$, whereby control signal values, which minimize errors between delay times of the variable delay circuit and the nominal amounts of delay, are generated in O-th to K-th rows of the calibration table in correspondence with the respective nominal setting signal values CS.

6. The variable delay circuit of claim 5, wherein there is prestored, as an initial value, a fixed value greater than said nominal delay step $d_s$ in the column of error of said calibration table in said memory.

7. The variable delay circuit of claim 5 or 6, wherein, if the delay time $t_{d0}$ between the input and output of said variable delay circuit, when supplied with a control signal $CC_0$ for bypassing all of said delay stages, is taken as an offset delay, said delay time measuring means measures the delay time $t_{d1}$ between the input and output of said variable delay circuit for each of said control signal values $CC_i$ and said calculating means obtains said amount of delay $D_i$ as given by the following equation:

$$D_i = t_{d1} - t_{d0}.$$

8. The variable delay circuit of claim 5 or 6, wherein an m-th (m=1, 2, ..., M) one of said delay stages is weighted about $2^{m-1}$.

* * * * *